United States Patent [19]
Beruto et al.

[11] Patent Number: 4,504,572
[45] Date of Patent: Mar. 12, 1985

[54] GELATIN SILVER HALIDE PHOTOGRAPHIC ELEMENTS FOR TANNING DEVELOPMENT

[75] Inventors: Marco Beruto; Antonio Luzzi; Piero Ramello, all of Savona, Italy

[73] Assignee: Minnesota Mining and Manufacturing Company, St. Paul, Minn.

[21] Appl. No.: 520,501

[22] Filed: Aug. 4, 1983

[30] Foreign Application Priority Data

Aug. 27, 1982 [IT] Italy ................................ 65209A/82

[51] Int. Cl.[3] ........................... G03C 1/06; G03F 7/02

[52] U.S. Cl. .................................... 430/264; 430/302; 430/306; 430/539; 430/566; 430/961

[58] Field of Search ............... 430/264, 302, 306, 566, 430/539, 961

[56] References Cited

U.S. PATENT DOCUMENTS

| | | | |
|---|---|---|---|
| 3,364,024 | 1/1968 | Yackel et al. | 96/29 |
| 4,299,909 | 10/1981 | Imatomi et al. | 430/264 |
| 4,369,245 | 1/1983 | Beruto et al. | 430/264 |
| 4,427,757 | 1/1984 | Beebe et al. | 430/306 |

*Primary Examiner*—Mary F. Downey
*Attorney, Agent, or Firm*—Donald M. Sell; James A. Smith; Mark A. Litman

[57] ABSTRACT

Silver halide photographic elements for tanning development including tanning developers, which can diffuse into the gelatin layer containing them, can be improved if they are associated with non-diffusing hydroquinones. In the case where such tanning developer is hydroquinone or a derivative thereof, said elements include such diffusing hydroquinone associated with a hydroquinone derivative non-diffusing in the gelatin layer containing it. Such non-diffusing hydroquinones preferably are hydroquinones substituted with aliphatic chains containing a total of at least twelve carbon atoms and, more preferably, are dispersed in the layer dissolved in a high-boiling organic solvent.

20 Claims, No Drawings

GELATIN SILVER HALIDE PHOTOGRAPHIC ELEMENTS FOR TANNING DEVELOPMENT

FIELD OF THE INVENTION

The present invention refers to photographic elements for tanning development suitable to obtain colloidal relief images and, more in particular, to photographic elements for tanning development suitable to obtain colored colloidal relief images.

BACKGROUND OF THE ART

It is known that photographic elements which contain unhardened gelatin layers, containing silver halide emulsions, can be image-wise made insoluble upon exposure to light and processing in the presence of tanning developers. In fact, the oxidation products of the tanning developer formed in the exposed regions of the image have the property of diffusing through the gelatin layers containing them and of hardening the gelatin itself. The unhardened regions, being unexposed and undeveloped, can be washed away with water or can be totally or partially transferred onto an image-receiving material.

U.S. Pat. No. 3,364,024 describes photographic elements consisting of a base having coated thereon a gelatin silver halide sensitive emulsion layer and having in adjacent position thereto to pigmented unsensitive layer of unhardened gelatin. Upon development of the exposed layer in the presence of a diffusing tanning developer of the hydroquinone type, the oxidation products of the hydroquinone upon diffusion harden the exposed regions of the sensitive layer and those regions of the pigmented layer adjacent thereto.

To make the process work properly, it is essential that the exposed silver halide be reactively associated with unhardened gelatin during development, where the developing agent is oxidized by the exposed silver halide to react with the (unhardened) gelatin to harden it. The silver halide emulsion and the unhardened gelatin can be present in the same layer or in different layers which are part of the same element, or in different elements which are put into contact prior to development. In any case, during development, it is essential for them to be in reactive association (with no barrier therebetween), to give the oxidized developer the possibility of diffusing from the reacted silver halide grains (reduced to silver) to the (unhardened) gelatin. The diffusing tanning developer can be comprised either in the layer containing the emulsion and/or the unhardened gelatin or in the developing bath.

U.S. Pat. No. 4,369,245 describes particular values of the silver coverage and silver/gelatin ratio of the sensitive layer and of the gelatin/tanning developer ratio in a photographic element for tanning development, which allow to obtain a better image quality and a higher exposure latitude.

In practice, for reasons of producivity, it is preferred to process said elements in an automatic processor provided with transporting rollers for the elements. Said processors schematically consist of a first tank containing an activating bath which consists of an alkali water solution and subsequent tanks containing a stop bath at neutral or acid pH and a washing bath by means of water sprays. The processors are provided with a series of rollers, of which some are dipped in the solutions and other are partially or totally outside them, to transport the elements into the tanks and from one tank to another.

The processing of photographic elements for tanning development performed in an automatic processor under such conditions, with respect to the manual processing, causes a decrease of the image quality even in elements whose critical parameters have been optimized, and this decrease appears as a worsening in the sharpness of the type edges and as fog formation.

SUMMARY OF THE INVENTION

According to the present invention, it is found that such photographic elements including tanning developers, which can diffuse in the gelatin layer containing them, can be improved if they are additionally associated with non-diffusing hydoquinones. In the specific case there the tanning developer is hydroquinone or a derivative thereof, as known in the art, the present invention comprises associating such diffusing hydroquinone with a non-diffusing hydroquinone derivative in the gelatin layer containing it.

DETAILED DESCRIPTION OF THE INVENTION

The present invention refers to a photographic element for tanning development, which includes a base having coated thereon at least one substantially unhardened gelatin layer associated with a light-sensitive silver halide emulsion, a water-insoluble photographically inert colored pigment and a tanning developer whose oxidation products, formed during development, can diffuse and are capable of hardening gelatin, characterized by said element further comprising at least one non-diffusing hydroquinone. Such non-diffusing hydroquinone preferably is substituted with aliphatic chains containing a total of at least twelve carbon atoms and, more preferably, is dispersed in the unhardened gelatin layer dissolved in a high-boiling organic solvent.

In particular, the present invention refers to a photographic element as described above, which comprises a base having coated thereon two superimposed substantially unhardened gelatin layers, one of which contains a light-sensitive silver halide emulsion and a tanning developer and the other a water-insoluble photographically inert colored pigment. The gelatin layer containing the non-diffusing hydroquinones of the present invention (preferably with ballasting groups directly bonded to the cyclic nucleus of the hydroquinone) is the gelatin layer which includes the light-sensitive silver halide emulsion and/or the gelatin layer which includes the water-insoluble photographically inert colored pigment. Preferably, the gelatin layer containing the non-diffusing hydroquinones is the external layer of the construction with two gelatin layers. Normally, to the purposes of the present invention, the elements coated on paper bases have the pigment layer coated on the base and the emulsion layer coated thereon. In the case of a transparent base (cellulose triacetate or polyester), the emulsion can be directly coated on the base and the pigment layer thereon or viceversa.

Still in particular, the present invention refers to a photographic element as described above, which comprises a base having coated thereon a single substantially unhardened gelatin layer including the light-sensitive silver halide emulsion, the water-insoluble photographically inert colored pigment, as well as the tanning developer. The various structures with single or double layer, as per above, may contain an external gelatin protective layer. In such cases, it is preferred to have the non-diffusing hydroquinone present in such a protective layer.

More in particular, the present invention refers to a photographic element as described above, in which the non-diffusing hydroquinone is present in the emulsion layer in a quantity from 0.02 to 0.15 grams per square meter or in the pigmented or protective layer as said above in a quantity from 0.1 to 1.0 gram per square meter.

Particularly useful for the purposes of the present invention are the non-diffusing hydroquinone derivatives, i.e. those having "ballasting" substituents which either prevent them from diffusing into the layer (or allow them to diffuse at very low rates which, under the processing conditions, should not cause significant migrations) during processing. The techniques to render the chemical auxiliaries non-diffusing are known in the conventional photography, where they have been studied with reference to couplers and then applied also to other chemical auxiliaries (for instance the Fischer technique, the dispersion technique and the loaded latex technique).

Apart from the various substituents that can be introduced into the benzene ring of the hydroquinone to vary the characteristics thereof, as known, it is essential to the purposes of the present invention that these non-diffusing hydroquinones bear groups which make the molecule heavier and the compound non-diffusing (or little diffusing) in the layer. Alkyl or aryl groups, preferably alkyl groups (substituted or not substituted), having up to at least 12 carbon atoms, more preferably at least 16 carbon atoms, proved to be particularly effective to the purposes of the present invention.

The non-diffusing hydroquinones preferred to the purposes of the present invention include the compounds (normally substituted hydroquinones, called nucleus-substituted hydroquinones) represented by the following general formula, wherein alkyl groups are introduced having up to at least 12, or more preferably 16 carbon atoms:

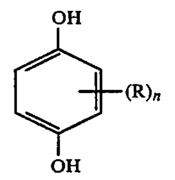

wherein R is an alkyl group, an alkoxy group, an arylalkyl group, an aryloxy group, an arylalkoxy group, a carbamoyl group, a sulfamoyl group, an acyl group, an alkoxycarbonyl group or an aryloxycarbonyl group, and n is a positive number from 1 to 4. The above said alkyl groups can be furthermore substituted with a substituent such as a halogen atom, an alkyl group, an aryl group, an alkoxy group, an aryloxy group, a carboxyl group, an alkoxycarbossyl group, an aryloxycarbonyl group, an acyloxy group, a carbamyl group, a sulfamyl group, an acylamino group, an imidò group or a hydroxyl group. Specific examples of nucleus-substituted hydroquinones are described for instance in U.S. Pat. Nos. 2,336,327; 2,360,290; 2,384,658; 2,403,721; 2,418,613; 2,675,314; 2,701,197; 2,704,713; 2,710,801; 2,722,556; 2,728,659; 2,732,300; 2,735,765; 2,816,028, 3,062,884; 3,236,893; in G.B. Pat. Nos. 557,750 and 557,802; in German patent application Ser. No. 2,149,789, as well as in Journal Of Organic Chemistry, vol. 22, pages 772 to 774.

Specifical examples of such hydroquinones are:

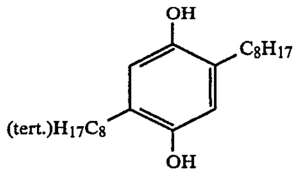

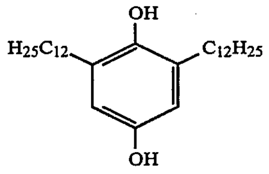

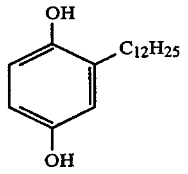

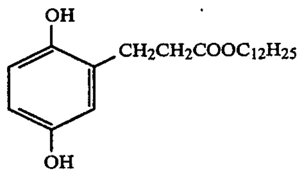

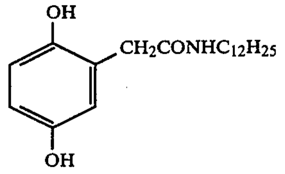

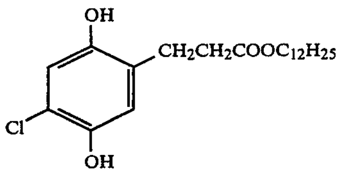

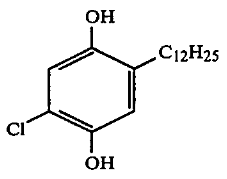

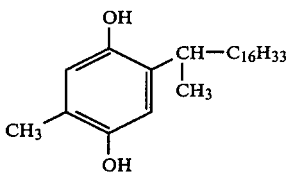

-continued

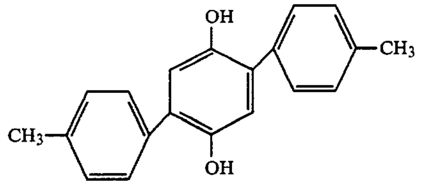

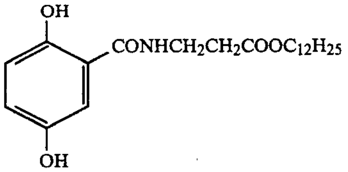

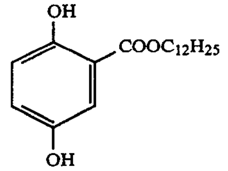

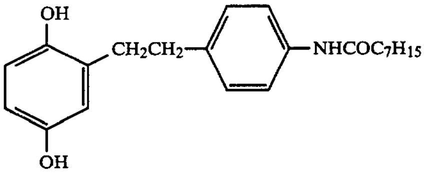

The non-diffusing hydroquinones are introduced into the gelatin layer of the photographic elements for tanning development of the present invention (alone or in combination therewith) in ways known from the conventional photography. A typical method of addition to the gelatin layer, which was adopted in the present invention since it was particularly simple and effective, is that of the dispersion in oil droplets, as described in U.S. Pat. Nos. 2,322,027; 2,801,170; 2,801,171 and 2,991,177. It consists of dissolving the hydroquinones in an organic solvent which is substantially water-immiscible and has a high boiling point (for instance higher than 200° C.), preferably with the aid of a less water-immiscible solvent having a lower boiling point (for instance between 20° and 170° C.) and then of dispersing the so-obtained solution in an aqueous medium, preferably containing gelatin or another hydrophilic colloidal substance, in the presence of a dispersing agent, in the form of small droplets (of sizes ranging from 0.1 to 1μ, more preferably from 0.15 to 0.30μ). Examples of substantially water-immiscible and high-boiling organic solvents are dibutylphthalate, tricresylphosphate, triphenylphosphate, di-n-hexyl-adypate, dimethylsebacate, quinitol-di-(2-ethylesocate) and 1,4-cyclohexyldimethylidene-di-(2-ethylesoate) used alone or in combination.

Examples of less water-immiscible organic solvents having a lower boiling point are methylacetate, ethylacetate, propylacetate, butylacetate, butylpropionate, cyclohexanol, nitromethane, chloroform, cyclohexane, ethyl alcohol, acetonitrile, dimethylformamide, dioxane, acetone, methylethylketone used alone or in combination.

The non-diffusing hydroquinones are introduced into a substantially unhardened gelatin layer of the photographic element for tanning development. (Substantially unhardened gelatin means gelatin which is not harder than one containing 0.3 grams of anhydrous formaline per kilogram of the freshly coated gelatin as said in U.S. Pat. No. 3,364,024). When such non-diffusing hydroquinones were introduced into the layer dispersed in a high-boiling organic solvent, they did not prove to hamper the process of image formation. On the contrary, they improved the quality of the obtained image. This may have occurred by preventing the unoxidized tanning agent, present in the developing bath, from re-entering the photographic element and being oxidized by atmospheric oxygen and then tanning gelatin without any correspondance between tanning and image. As already said, these compounds are deemed to be more usefully present in the external layer, where they can act at the air-photographic element interface. On the other hand it has been also evidenced that hydroquinone derivatives bearing low molecular weight alkyl groups, for instance 2,5-ditert.-butylhydroquinone and 2,5-ditert.pentylhydroquinone, if introduced into an external layer of the element, produce adverse effects or do not produce the beneficial effects according to the present invention.

Other antioxidant agents, such as sulfite and ascorbic acid, can be used in combination with the non-diffusing hydroquinones of the present invention. Being capable of migrating, they may however negatively interfere with the process of image formation. It may still be useful to introduce small quantities thereof in the case of higher silver coverages. Their employment is anyhow to be taken into consideration carefully and their use is unadvised, unless clear advantages are obtained in particular constructions.

The gelatin layer in the photographic element for tanning development containing the dispersed non-diffusing hydroquinones of the present invention is associated with a light-sensitive silver halide emulsion, with a water-insoluble photograpically inert colored pigment and with a tanning developer.

The silver halide emulsions used in the present invention comprise the conventional silver halides, such as, for example, silver chloride, silver bromide, silver chloro-iodide, silver chlorobromide, silver bromo-iodide and silver chloro-bromo-iodide.

Any dye material or pigment used in photography, which does not diffuse in the gelatin layer and does not react with the photographic emulsion to give adverse phenomena such as fog or desensitization, can be used in the present invention. Carbon black, colloidal silver, organic or inorganic pigments are examples of such dye materials. Organic pigments are preferred since they provide photographic elements for tanning development with better stability over time. Particularly useful proved to be organic pigments in water dispersion, such as for instance Flexonil Blau of Hoechst, Rosso Sintosol NFRG and Arancio Veleste NPG, as well as Turchese Sintosol of ACNA. Such water dispersions are obtained by dispersing the water-in-soluble pigments in water containing either a solvent or a water-soluble polymer which act as a support for the pigments themselves. Some dye mixtures, chosen to absorb the red, green and blue light to form a layer colored with black, proved to be particularly suitable to obtain black-colored images, as described hereinbelow in details.

Among the tanning developers whose oxidation products formed during development of the exposed element are capable of hardening the gelatin, hydroquinone (and the derivatives thereof such as chlorohydroquinone, bromohydroquinone, methylhydroquinone, morpholinomethylhydroquinone, carboxyhydroquinone, carbamoylhydroquinone, methoxycarbonylhydroquione, hydroxyethylaminocarbonylhydroquinone, etc.) is the most preferred because of its larger range of action due to the better stability of its oxidation product. In spite of this, also other tanning developers, such as catechol, pyrogallol, gallic acid, etc., can find application in the photographic elements for tanning development (when no large range of action is needed, as, for example, in elements where the tanning developer, the gelatin and the silver halide emulsion are in the same layer).

A single layer of gelatin coated on the base can contain the silver halide emulsion, the colored pigment and the tanning developer (if incorporated in the layer) at the same time; or these three components of the photographic element can be present in separate layers of gelatin coated on the base, such that, for instance, a gelatin layer contains the pigment and another gelatin layer contains the silver halide emulsion and the tanning developer; or finally the three components can be contained in gelatin layers coated on different bases to be put into contact during development.

Particularly useful to the purposes of the present invention proved to be the presence of a gelatin protective layer coated on the photographic element for tanning development in order to obtain a better image quality of the developer element.

The non-diffusing hydroquinones useful to the purposes of the present invention can be introduced into the gelatin protective layer of the photographic element, into a gelatin layer containing the silver halide emulsion, into a gelatin layer containing the pigment or into a gelatin layer containing both the emulsion and the pigment. In the cases where they are introduced into a gelatin protective layer or into a gelatin layer containing the pigment, the quantity of the non-diffusing hydroquinones can range from 0.01 to 1, more preferably from 0.05 to 0.5 and most preferably from 0.1 to 0.02 grams per square meter. In the case where they are introduced into a gelatin layer containing the silver halide emulsion, the hydroquinone quantity can range from 0.02 to 0.15, more preferably from 0.03 to 0.08 and most preferably from 0.04 to 0.06 grams per square meter.

The photographic elements for tanning development most preferred in the practice of the present invention are those in which the silver content of the light sensitive layer is lower than 0.6, preferably lower than 0.5, most preferably lower than 0.4 grams per square meter, the weight silver/gelatin ratio of the sensitive layer is lower than 0.4, preferably lower than 0.3 and most preferably lower than 0.2 and the weight gelatin/tanning developer ratio is comprised between 3 and 25, preferably between 5 and 20, most preferably between 6 and 18.

The photographic elements for tanning development of the present invention after exposure can be developed by dipping them into an alkaline activating bath, then into a stop bath and finally by washing with water sprays. The alkaline activating bath contains an alkali agent, such as sodium or potassium carbonate, sodium or potassium hydroxide, etc. Particularly useful was an activating bath including significant quantities of a water-miscible organic solvent, chosen in the solvent class including dihydric alcohols, polyhydric alcohols and polyoxyethyleneglycols or mixture thereof and, more particularly, significant quantities of sodium sulfate, this in order to improve the quality and reproducibility of the photographic results obtained, particularly when processing is performed in automatic processors provided with transporting rollers in contact with air.

The stop bath can be a fixing bath, preferably a bleach-fixing bath (containing ferric ammonium EDTA and thiosulfate), or a diluted acetic acid bath or simply water to remove developer.

The following examples report the evaluation of the exposure and processing tests performed with the photographic elements according to the present invention.

In particular, as regards the tests where the elements were exposed through the base in contact with a screen for times ranging from 1 to 3 seconds using a 9 lux tungsten lamp (bromograph), and which refer to the application of the photographic elements of the present invention in graphic arts (wherein the images are obtained under the form of dots or lines), the tanning quantity, the sharpness of the letters, the optical density and the dot quality were evaluated. The reported evaluation was obtained by working out the average of the subjective evaluations made by different people on more than one sample of each element. As regards in particular the tests in which the elements were exposed in a Phototypesetter for times ranging from 3 to 5 millionths of second with a flash of from 1000 to 1100 volts and which refer to the application of the photographic elements of the present invention in the field of photocomposition for the print of types, the fog, the sharpness, the optical density, the letter closure and the reproduction mark were each evaluated. Very critical types (sources) were chosen (such Engravers, Roman Shaded, Uncle Sam, etc.) and for each source sizes (bodies) ranging from 6 to 18 were chosen. Fog was considered acceptable only if absent; a fog which could be measured was considered unacceptable. The sharpness was evaluated by means of a 50x lens considering also the dot neatness and the line linearity, the microcontrast and the image graininess. The optical density was measured with a reflection microdensitometer in the case of large sizes (and it is insufficient if lower than 1.3, sufficient if is between 1.3 and 1.5, very good if higher than 1.5) and by means of visual observation with a 10x lens in the case of small sizes. The closure of the letters in the types formed by double lines was evaluated with a 10x lens. Finally, the reproducibility mark was a compendium of all factors integrated by the people making the evaluations upon a comparison with the best conventional elements. The marks (regarding fog, sharpness, optical density, letter closure and reproducibility) range from 0 to 10, where 0 is the best, up to 2 is very good, from 3 to 4 is good, from 4 to 5 is sufficient, above 5 is insufficient.

EXAMPLE 1

A photographic element for tanning development (Film A) was prepared by coating a subbed polyester base with the following layers in the indicated order:

(1) a light-sensitive unhardened gelatin layer containing a silver bromo-chloride emulsion (having 34% mole silver bromide) at a silver coverage of 0.35 g/m$^2$, gelatin in a quantity to obtain a silver to gelatin ratio (w/w) of 0.1 and hydroquinone in a quantity to obtain a gelatin/hydroquinone ratio (w/w) of 6;

(2) a light-insensitive unhardened gelatin layer containing gelatin at a coverage of 3.4 g/m$^2$ and the pigment Flexonil Blau and Rosso Sintosol NFRG in a quantity to obtain a pigment/gelatin ratio (w/w) of 4.5 and an optical density higher than 4;

(3) an unhardened gelatin protective layer containing gelatin at a coverage of 1 $g/m^2$.

A second element (Film B) for tanning development was prepared by coating a subbed polyester base with the following layers in the indicated order:

(1) the same light-sensitive gelatin layer of Film A;

(2) the same pigmented gelatin layer of Film A;

(3) an unhardened gelatin protective layer containing gelatin at a coverage of 1 $g/m^2$ and 2,5-diisooctylhydroquinone (DIOH), dispersed in tricresylphosphate (TCP), at the coverage of 0.2 $g/m^2$.

A third film (Film C) for tanning development was prepared by coating a subbed base with the following layers in the indicated order:

(1) the same light-sensitive gelatin layer of Film A;

(2) the same pigmented gelatin layer of Film A;

(3) the same unhardened gelatin protective layer containing gelatin at a coverage of 1 $g/m^2$, DIOH dispersed with TCP at a coverage of 0.3 $g/m^2$ and 0.8 $g/m^2$ of sodium sulfite.

Samples of the three films were exposed through the base in contact with a screen, viz. Tint Guide of Beta Screen Corp., and processed in an automatic processor provided with rollers in an activating bath of the following composition for 30 seconds at 27° C.:

sodium carbonate 18% (by weight): 600 ml.

ethyleneglycol: 400 ml.

then in stop bath consisting of 2°/$_{oo}$ acetic acid in water for 20 seconds at 40° C. and finally washed with water at room temperature.

As described above, tanning, sharpness, optical density (O.D.) and the dot quality were evaluated on the processed samples. The following table reports the results of the evaluation:

| Film | Tanning | Sharpness | O.D. | Dot quality |
|---|---|---|---|---|
| A | Good | Bad | Good | Bad |
| B | Good | Very good | Good | Good |
| C | Good | Very good | Good | Very good |

EXAMPLE 2

A photographic element (Film A) for tanning development was prepared as Film A of Example 1.

A second and a third element (Film B and C) for tanning development were prepared by coating a subbed polyester base with the following layers in the indicated order, respectively:

(1) the same light-sensitive gelatin layer of Film A;

(2) the same pigmented gelatin layer of Film A;

(3) an unhardened gelatin protective layer containing gelatin at a coverage of 1 $g/m^2$, DIOH dispersed with dibutylphthalate (DBP) and tricresylphosphate (TCP) at a coverage of 0.5 (Film B) and 1 (Film C) $g/m^2$, respectively.

A fourth element (Film D) for tanning development was prepared by coating the base with the following layers in the indicated order:

(1) the same light-sensitive gelatin layer of Film A;

(2) the same pigmented gelatin layer of Film A;

(3) an unhardened gelatin protective layer containing gelatin at the coverage of 1 $g/m^2$ and DIOH, dispersed with TCP, at the coverage of 0.64 $g/m^2$.

Samples of the four films were exposed and processed as described in Example 1.

The following table reports the results of the pertinent evaluations:

| Film | Tanning | Sharpness | O.D. | Dot quality |
|---|---|---|---|---|
| A | Very good | Sufficient | Good | Bad |
| B | Very good | Good | Good | Sufficient |
| C | Very good | Good | Good | Good |
| D | Very good | Good | Good | Good |

EXAMPLE 3

A photographic film (Film A) for tanning development was prepared as Film A of Example 1.

Five other films (Film from B to F) were prepared as Film A, having 0.42 $g/m^2$ of the following compounds dispersed in the protective layer:

Film B: DIOH;

Film C: Gallosan 12 ether;

Film D: 2,5-ditert.pentylhydroquinone;

Film E: 2,5-ditert.butylhydroquinone;

Film F: Antioxidant 720.

Samples of the six films were exposed and processed as described in Example 1.

The following table reports the results of the pertinent evaluations:

| Film | Tanning | Sharpness | O.D. | Dot quality |
|---|---|---|---|---|
| A | Very good | Bad | Very good | Bad |
| B | Very good | Very good | Very good | Very good |
| C | Very good | Good | Very good | Good |
| D | Sufficient | Sufficient | Bad | Bad |
| E | Bad | Good | Bad | Very good |
| F | Very good | Bad | Very good | Bad |

EXAMPLE 4

A photographic element (Film A) for tanning development was prepared by coating a 10/100 resin coated paper base with the following layers in the indicated order:

(1) a light-insensitive unhardened gelatin pigmented layer containing gelatin at coverage of 3 $g/m^2$ and a pigment dispersion (consisting of 4.3% gelatin, 11% pigment Rosso Sintosol and 9% pigment Flexonil Blau) at a pigment total coverage of 1.7 $g/m^2$ and phenidone at the coverage of 0.025 $g/m^2$;

(2) a light-sensitive unhardened gelatin layer containing a silver chloro-bromo-iodide emulsion (having 88% bromide moles, 7% iodide moles and 5% chloride moles) at the coverage of 0.5 $g/m^2$, gelatin in a quantity as to obtain a silver/gelatin ratio of 0.3 and hydroquinone in a quantity as to obtain a gelatin/hydroquinone ratio of about 6;

(3) an unhardened gelatin protective layer at the coverage of 1 $g/m^2$.

A second, a third and a fourth element (Films B, C and D) for tanning development were prepared by coating a 10/100 resin coated paper base with the following layers in the indicated order, respectively:

(1) the same light-insensitive gelatin pigmented layer of Film A;

(2) the same light-sensitive gelatin layer of Film A;

(3) an unhardened gelatin protective layer containing gelatin at the coverage of 1 $g/m^2$ and DIOH, dispersed with TCP, at the coverage of 0.95 (Film B), 0.48 (Film C) and 1.44 (Film D) g/m$^2$, respectively.

Samples of the elements were exposed in a 7700 Compugraphic Editwriter Phototypesetter and processed in a roller automatic processor in the following processing lines A and B:

Processing line A:

(1) 55 seconds at 28° C. in 700 ml. of 18% $Na_2CO_3$ and 300 ml. of ethyleneglycol;

(2) 30 seconds at 40° C. in 0.2% acetic acid;

(3) washing with water sprays at room temperature.

Processing line B:

(1) 55 seconds at 33° C. in 120 g/liter of $Na_2SO_4$ and 20 g/liter of $Na_2CO_3$ (2) 30 seconds at 38° C. in 10 g/liter of $Na_2SO_3$ and 75 g/liter of $Na_2SO_4$ (3) washing with water sprays at room temperature.

As described hereinbefore, the processed samples were evaluated as regards fog, sharpness, optical density (O.D.), letter closure and reproducibility thereof. The following table reports the results of the evaluations:

| Film | Fog | Sharpness | O.D. | Letter closure | Reproducibility |
|---|---|---|---|---|---|
| A* | — | — | — | — | — |
| B | 0 | 3 | 1 | 2 | 2 |
| C | 3.5 | 5 | 1 | 4 | 2 |
| D | 1 | 4 | 1 | 3 | 2 |

*This sample resulted completely fogged.

Slightly better results were obtained with the samples processed in processing line B with respect to those processed in processing line A.

EXAMPLE 5

A first, a second and a third photographic element (Films A, B and C) for tanning development were prepared by coating a 10/100 resin coated paper base with the following layers in the indicated order, respectively:

(1) a light-sensitive gelatin pigmented layer containing gelatin at the coverage of 1.5 g/m$^2$ and a pigment dispersion (consisting of 4.3% gelatin, 11% Rosso Sintosol and 9% Flexonil Blau) at a pigment total coverage of 0.8 g/m$^2$ and phenidone at the coverage of 0.025 g/m$^2$;

(2) a light-sensitive unhardened gelatin layer containing the emulsion of example 4 at a silver coverage of 0.4 g/m$^2$, gelatin in a quantity as to obtain a silver/gelatin weight ratio of 0.3, hydroquinone in a quantity as to obtain a gelatin/hydroquinone weight ratio of 12 and DIOH, dispersed in TCP, at the coverage of 0.02 (Film A), 0.05 (Film B) and 0.08 (Film C) g/m$^2$, respectively.

A fourth photographic element (Film D) for tanning development was prepared by coating a 10/100 resin coated paper base with the following layers in the indicated order:

(1) the same gelatin pigmented layer of Film A;

(2) the same sensitive gelatin layer of Film A, but not containing DIOH;

(3) an unhardened gelatin protective layer containing gelatin at the coverage of 1 g/m$^2$ and DIOH, dispersed in TCP, at the coverage of 0.2 g/m$^2$.

Samples of the elements were exposed in a 7700 Compugraphic Editwriter Phototypesetter and processed in a roller automatic processor in the following processing line:

(1) 25 seconds at 32° C. in 130 g/liter of $Na_2SO_4$ at pH 12.2;

(2) 30 seconds at 40° C. in water;

(3) washing with water sprays at room temperature.

The following table reports the results of the evaluations:

| Film | Fog | Sharpness | O.D. | Letter closure | Reproducibility |
|---|---|---|---|---|---|
| A | 0.5 | 3 | 1 | 2 | 1 |
| B | 0 | 3 | 1 | 1 | 1 |
| C | 0 | 3 | 1 | 1 | 1 |
| D | 0 | 3 | 1 | 1 | 1 |

EXAMPLE 6

Four photographic elements (Films from A to D) were prepared by coating a 10/100 resin coated paper base with the following layers, respectively:

(1) a light-insensitive unhardened gelatin pigmented layer at a gelatin coverage of 3 g/m$^2$, containing the pigment dispersion of Example 4 at the pigment total coverage of 1.7 g/m$^2$;

(2) a light-sensitive unhardened gelatin layer containing the emulsion of Example 4 at a silver coverage of 0.5 g/m$^2$, gelatin in a quantity as to obtain a silver/gelatin weight ratio of 0.3 and hydroquinone in a quantity as to obtain a gelatin/hydroquinone weight ratio of 6;

(3) an unhardened gelatin protective layer containing gelatin at the coverage of 1 g/m$^2$ and DIOH, dispersed with TCP, at the coverage of 1 (Film A), 0.86 (Film B), 0.77 (Film C) and 0.67 (Film·D) g/m$^2$, respectively.

Four other photographic elements (Films from E to H) were prepared by coating a 10/100 resin coated paper base with the following layers in the indicated order, respectively:

(1) the same pigmented layer of Film A;

(2) the same sensitive layer of Film A;

(3) an unhardened gelatin protective layer containing gelatin at the coverage of 1 g/m$^2$ and DIOH, dispersed with DBP and TCP, at the coverage of 1 (Film E), 1.44 (Film F), 0.58 (Film G) and 0.38 (Film H) g/m$^2$, respectively.

Samples of the elements were exposed and developed as described in Example 5.

The following table reports the results of the evaluations:

| Film | Fog | Sharpness | O.D. | Letter closure | Reproducibility |
|---|---|---|---|---|---|
| A | 0 | 3 | 1 | 1 | 2 |
| B | 0 | 3 | 1 | 1 | 2 |
| C | 0 | 3 | 1 | 1 | 2 |
| D | 0 | 4 | 1 | 1 | 2 |
| E | 1 | 4 | 1 | 3 | 2 |
| F | 1 | 3 | 1 | 2 | 2 |
| G | 1 | 3 | 1 | 1 | 2 |
| H | 1 | 3 | 1 | 2 | 2 |

EXAMPLE 7

A photographic element for tanning development (Film A) was prepared by coating a 10/100 resin coated paper base with the following layers in the indicated order:

(1) a light-sensitive unhardened gelatin pigmented layer containing gelatin at the coverage of 1.5 $g/m^2$, the pigment dispersion of Example 4 at the pigment total coverage of 0.8 $g/m^2$ and phenidone at the coverage of 0.04 $g/m^2$;

(2) a light-sensitive unhardened gelatin layer containing the emulsion of Example 4 at the silver coverage of 0.48 $g/m^2$, gelatin in a quantity as to obtain a silver/gelatin weight ratio of 0.3 and hydroquinone in a quantity as to obtain a gelatin/hydroquinone weight ratio of 12.

A second and third element (Film B and C) were prepared as said above respectively having the following sequence of layers:

(1) the same pigmented layer of Film A;

(2) the same sensitive layer of Film A, but containing DIOH, dispersed with TCP, at the coverage of 0.025 (Film B) and 0.05 (Film C) $g/m^2$, respectively.

A fourth element (Film D) was prepared as said above having the following sequence of layers:

(1) the same sensitive layer of Film A, but containing DIOH, dispersed with TCP, at the coverage of 0.025 $g/m^2$, (2) the same sensitive layer of Film A, but containing DIOH, dispersed with TCP, at the coverage of 0.025 $g/m^2$.

A fifth and sixth element (Film E and F) were prepared as said above having the following sequence of layers:

(1) the same pigmented layer of Film A, but containing DIOH, dispersed with TCP, at the coverage of 0.025 (Film E) and 0.05 (Film F) $g/m^2$, respectively;

(2) the same light-sensitive layer of Film A.

Samples of the elements were exposed and developed as described in Example 5.

The following table reports the results of the evaluations:

| Film | Fog | Sharpness | O.D. | Letter Closure | Reproducibility |
|---|---|---|---|---|---|
| A | 2 | 3.5 | 1 | 2 | 3.5 |
| B | 1.5 | 3.3 | 1 | 1 | 2 |
| C | 1 | 3 | 1 | 1 | 1.5 |
| D | 1 | 3 | 1 | 1 | 1.5 |
| E | 1 | 3 | 1 | 1 | 1.5 |
| F | 3 | 1 | 1 | 1 | 1.5 |

EXAMPLE 8

A photographic element (Film A) for tanning development was prepared by coating a 10/100 resin coated paper base with the following layers in the indicated order:

(1) a light-sensitive unhardened gelatin layer containing a silver bromo-iodide emulsion (having 93% bromide moles and 7% iodide moles) at a silver coverage of 0.4 $g/m^2$, gelatin in a quantity as to obtain a silver/gelatin weight ratio of 0.075, hydroquinone in a quantity as to obtain a gelatin/hydroquinone weight ratio of 7.5 and pigment Flexonil Blau at the coverage of 0.35 $g/m^2$;

(2) an unhardened gelatin protective layer containing gelatin at the coverage of 1 $g/m^2$ and DIOH, dispersed with TCP, at the coverage of 0.1 $g/m^2$.

A second photographic element (Film B) for tanning development was prepared by coating a 10/100 resin coated paper base in the indicated order:

(1) a light-sensitive unhardened gelatin layer containing the emulsion of Example 4 at the silver coverage of 0.4 $g/m^2$, gelatin at the coverage of 1.3 $g/m^2$, hydroquinone in a quantity as to obtain a gelatin/hydroquinone weight ratio of 6, phenidone in a quantity of 0.05 $g/m^2$, the pigment dispersion of Example 4 at the pigment total coverage of 0.8 $g/m^2$ and DIOH, dispersed as said above, at the coverage of 0.05 $g/m^2$;

(2) an unhardened gelatin protective layer containing gelatin at the coverage of 1 $g/m^2$.

A third element (Film C) for tanning development was prepared by coating a 10/100 resin coated paper base with the following layers in the indicated order:

(1) a light-sensitive unhardened gelatin layer containing a silver chloro-bromide emulsion (having 66% chloride moles and 35% bromide moles) at the silver coverage of 0.4 $g/m^2$, gelatin in a quantity as to obtain a silver/gelatin ratio of 0.075, hydroquinone in a quantity as to obtain a gelatin/hydroquinone ratio of 5.7 and pigment Flexonil Blau at the coverage of 0.35 $g/m^2$;

(2) the same unhardened gelatin protective layer of Film A;

Samples of the three elements were exposed for 3 microseconds to a Xenon flash. The exposed samples were processed in an automatic roller processor in an activating bath of the following composition for 30 seconds at 27° C.:

sodium carbonate 18%: 700 ml.

ethyleneglycol: 300 ml.

then in a stop bath consisting of 2% acetic acid and finally washed with water sprays at room temperature. The following table reports the results of the evaluations:

| Film | Fog | Sharpness | O.D. | Letter Closure | Reproducibility |
|---|---|---|---|---|---|
| A | 0 | 4 | 1 | 1 | 2.0 |
| B | 0 | 2 | 1 | 1 | 1* |
| C | — | — | — | — | — |

*At 3 microseconds no image is obtained since the film has not a sufficient sensitivity.

We claim:

1. A photographic element for tanning development which comprises a base having coated thereon at least a substantially unhardened gelatin layer reactively associated with a light-sensitive silver halide emulsion, a photographically inert water-insoluble colored pigment and a tanning developer, characterized in that said element includes in addition to said tanning developer at least one non-diffusing hydroquinone dispersed in said gelatin layer.

2. Photographic element for tanning development according to claim 1, which comprises a base having coated thereon two superimposed substantially unhardened gelatin layers, one of which includes a light-sensitive silver halide emulsion layer and a tanning developer and the other a photographically inert water-insoluble colored pigment.

3. Photographic element for tanning development according to claim 2, wherein the gelatin layer containing the non-diffusing hydroquinones is the gelatin layer comprising the light-sensitive silver halide emulsion coated on the layer comprising the pigment.

4. Photographic element for tanning development according to claim 2, wherein the gelatin layer containing the non-diffusing hydroquinones is the gelatin layer comprising the photographically inert water-insoluble colored pigment coated on the layer comprising the emulsion.

5. Photographic element according to claim 1, which comprises a base having coated thereon a single substantially unhardened gelatin layer including a light-sensitive silver halide emulsion layer, a photographically inert water-insoluble colored pigment and a tanning developer.

6. Photographic element for tanning development according to claim 2 characterized by having a gelatin layer coated as a protective layer including said non-diffusing hydroquinone.

7. Photographic element for tanning development according to claim 1 wherein the hydroquinone nucleus is substituted with alkyl groups having a total of at least 12 carbon atoms.

8. Photographic element for tanning development according to claim 3 wherein the quantity of the non-diffusing hydroquinones is between 0.02 to 0.15 grams per square meter.

9. Photographic element for tanning development according to claim 4 wherein the quantity of the non-diffusing hydroquinones is between 0.1 and 1.0 grams per square meter.

10. Photographic element for tanning development according to claim 5, characterized by having a gelatin layer coated as a protective layer including said non-diffusing hydroquinone.

11. Photographic element for tanning development according to claim 2, wherein the hydroquinone nucleus is substituted with alkyl groups having a total of at least 12 carbon atoms.

12. Photographic element for tanning development according to claim 3, wherein the hydroquinone nucleus is substituted with alkyl groups having a total of at least 12 carbon atoms.

13. Photographic element for tanning development according to claim 4, wherein the hydroquinone nucleus is substituted with alkyl groups having a total of at least 12 carbon atoms.

14. Photographic element for tanning development according to claim 5, wherein the hydroquinone nucleus is substituted with alkyl groups having a total of at least 12 carbon atoms.

15. Photographic element for tanning development according to claim 6, wherein the hydroquinones nucleus is substituted with alkyl groups having as total of at least 12 carbon atoms.

16. Photographic element for tanning development according to claim 5, wherein the quantity of the non-diffusing hydroquinones is between 0.02 to 0.15 gram per square meter.

17. Photographic element for tanning development according to claim 6, wherein the quantity of the non-diffusing hydroquinones is between 0.1 and 1.0 gram per square meter.

18. The element of claim 1 further comprising 1-phenyl-3-pyrazolidone.

19. The element of claim 7 further comprising 1-phenyl-3-pyrazolidone.

20. The element of claim 15 further comprising 1-phenyl-3-pyrazolidone.

* * * * *